(12) United States Patent
Ge et al.

(10) Patent No.: US 10,655,955 B2
(45) Date of Patent: *May 19, 2020

(54) TIME-SPACE CODING METHOD AND APPARATUS FOR GENERATING A STRUCTURED LIGHT CODED PATTERN

(71) Applicant: Ningbo Yingxin Information Technology Co., Ltd., Ningbo (CN)

(72) Inventors: Chenyang Ge, Ningbo (CN); Huimin Yao, Ningbo (CN); Yanhui Zhou, Ningbo (CN)

(73) Assignee: NINGBO YINGXIN INFORMATION TECHNOLOGY CO., LTD., Ningbo (CN)

( * ) Notice: Subject to any disclaimer, the term of this patent is extended or adjusted under 35 U.S.C. 154(b) by 5 days.

This patent is subject to a terminal disclaimer.

(21) Appl. No.: 16/102,636

(22) Filed: Aug. 13, 2018

(65) Prior Publication Data

US 2019/0178635 A1    Jun. 13, 2019

(30) Foreign Application Priority Data

Dec. 8, 2017    (CN) .......................... 2017 1 1302566

(51) Int. Cl.
*G01B 11/25* (2006.01)
*G06T 7/521* (2017.01)
(Continued)

(52) U.S. Cl.
CPC .............. *G01B 11/25* (2013.01); *G01B 11/22* (2013.01); *G01B 11/2513* (2013.01);
(Continued)

(58) Field of Classification Search
CPC ......... G01B 11/22; G01B 11/24; G01B 11/25; G01B 11/2509; G01B 11/2513;
(Continued)

(56) References Cited

U.S. PATENT DOCUMENTS 7,916,932 B2 *    3/2011    Lee ..................... G01B 11/2513
                                                                353/34
7,929,752 B2 *    4/2011    Je ....................... G01B 11/2509
                                                                382/154
(Continued)

FOREIGN PATENT DOCUMENTS

| CN | 103796004 | 5/2014 |
| CN | 103824318 | 5/2014 |
| CN | 105120257 | 12/2015 |

*Primary Examiner* — Gordon J Stock, Jr.
(74) *Attorney, Agent, or Firm* — Dragon Sun Law Firm, PC; Jinggao Li, Esq.

(57) ABSTRACT

The present disclosure provides a time-space coding method and apparatus for generating a structured light coded pattern. Different coded patterns are outputted in time division by driving different light-emitting points based on a regular light-emitting lattice so as to time-space label a target object or a projection space. This method effectively overcomes the limitations of the fact that in the prior art, a plurality of projectors is needed to project different patterns in time division when it is required to project time-space labels of a plurality of patterns. According to the present method, by driving different light-emitting elements on the light-emitting substrate, different coded patterns are formed, and by using a time-division output technology, time-space labeling of an object may be finalized with only one projector. Moreover, this method may significantly improve the accuracy and robustness of three-dimensional depth measurement through time-space coding with a depth decoding algorithm.

10 Claims, 8 Drawing Sheets

(51) Int. Cl.
*H04N 13/271* (2018.01)
*H04N 13/254* (2018.01)
*G01B 11/22* (2006.01)
*G02B 27/48* (2006.01)
*H04N 13/00* (2018.01)
*H01S 5/42* (2006.01)

(52) U.S. Cl.
CPC .............. *G02B 27/48* (2013.01); *G06T 7/521* (2017.01); *H04N 13/254* (2018.05); *H04N 13/271* (2018.05); *G06T 2207/10028* (2013.01); *H01S 5/423* (2013.01); *H04N 2013/0081* (2013.01)

(58) Field of Classification Search
CPC .............. G01B 11/2518; G01B 11/254; G01B 11/2545; G01B 11/2531; G01B 11/2536; H04N 2013/0074; H04N 2013/0077; H04N 2013/0081; H04N 13/207; H04N 13/211; H04N 13/218; H04N 13/254; H04N 13/257; H04N 13/271; H04N 13/0239; H04N 13/0082; G06T 7/50; G06T 7/521; G06T 7/0075; G06T 7/0022; G06T 7/0057; G06T 2207/10012; G06T 2207/10028; G06T 2207/10152; H01S 5/005; H01S 5/40; H01S 5/4025; H01S 5/42; H01S 5/423; H01S 5/426; G02B 27/48; G03B 21/00; G03B 21/20; G03B 21/2006; G03B 21/2013; G03B 21/2033; G03B 21/204

See application file for complete search history.

(56) References Cited

U.S. PATENT DOCUMENTS

| | | | | |
|---|---|---|---|---|
| 8,142,023 B2* | 3/2012 | Lim | .................... | G06K 9/2036 353/28 |
| 8,805,057 B2* | 8/2014 | Taguchi | ............ | G01B 11/2509 382/153 |
| 9,268,012 B2* | 2/2016 | Ghosh | .................... | G01S 7/4815 |
| 9,361,698 B1* | 6/2016 | Song | ........................ | G06T 7/521 |
| 9,448,064 B2* | 9/2016 | Atanassov | ............. | G06T 5/001 |
| 9,454,821 B2* | 9/2016 | Ge | ........................ | G06K 9/2036 |
| 9,514,378 B2* | 12/2016 | Armstrong-Crews | ....................... | G03B 35/00 |
| 9,606,237 B2* | 3/2017 | Herschbach | ............ | G01S 17/48 |
| 9,626,568 B2* | 4/2017 | Tang | .................. | G06K 9/00711 |
| 9,712,806 B2* | 7/2017 | Olmstead | ................ | G06T 7/521 |
| 9,740,019 B2* | 8/2017 | Mor | .................... | G01B 11/2513 |
| 9,754,376 B1* | 9/2017 | Ge | ......................... | G06T 7/521 |
| 9,826,216 B1* | 11/2017 | Hazeghi | ............ | G02B 27/0075 |
| 9,946,089 B2* | 4/2018 | Chen | .................. | G03B 21/2033 |
| 10,032,279 B2* | 7/2018 | Inaba | ......................... | G06T 7/13 |
| 10,048,504 B2* | 8/2018 | Herschbach | ........ | G02B 27/0977 |
| 10,068,338 B2* | 9/2018 | Atanassov | ............ | G06K 9/2027 |
| 10,089,739 B2* | 10/2018 | Appia | ...................... | G06T 7/521 |
| 10,139,217 B1* | 11/2018 | Holt | .................... | G01B 11/002 |
| 10,148,897 B2* | 12/2018 | Perlman | ............. | H04N 5/3572 |
| 10,225,544 B2* | 3/2019 | Thuries | ................ | G06K 9/2036 |
| 10,277,878 B2* | 4/2019 | Hitomi | .................. | G06T 1/0007 |
| 10,295,655 B2* | 5/2019 | Braker | ............... | G01B 11/2531 |
| 10,381,805 B2* | 8/2019 | Ge | ........................... | H01S 5/423 |
| 2018/0347967 A1* | 12/2018 | Ge | ........................... | G01B 11/2513 |
| 2019/0139242 A1* | 5/2019 | Liu | .......................... | G06T 7/521 |
| 2019/0249984 A1* | 8/2019 | Barlev | .................... | G01B 11/25 |

* cited by examiner

TIME-SPACE CODING METHOD AND APPARATUS FOR GENERATING A STRUCTURED LIGHT CODED PATTERN

CROSS-REFERENCE TO RELATED APPLICATION

This application claims the priority to Chinese Patent Application No. 201711302566.X, filed Dec. 8, 2017 in the State Intellectual Property Office of P.R. China, which is expressly incorporated by reference herein in its entirety.

FIELD

The present disclosure generally relates to the technical field of computer vision, depth perception, and three-dimensional reconstruction, and more particularly to a method and apparatus for generating a structured light coded pattern in an active vision depth perception technology.

BACKGROUND

As a hotspot for researches and application developments in the field of computer vision, a depth perception technology is intended for perceiving shape and distance information of a spatial object. Compared with a binocular stereoscopic camera, a structured light-based active vision depth perception technology may acquire depth information of an image more accurately, and the depth image information acquired thereby has the following advantages: higher stability and reliability, insusceptibility to ambient light, a simple stereoscopic matching process, and a low algorithm computation complexity, etc. In the patent No. CN103824318B entitled "Multi-Camera-Array Depth Perception Method," the patent application No. CN105120257A entitled "Structured Light Coding-Based Vertical Depth Perception Apparatus," and the patent No. CN103796004B entitled "Active Structured Light Binocular Depth Perception Method," they all use a laser image projector or other coded pattern projectors to project a fixed coded pattern for structured-light coding a space, and then use the coding information to perform depth computation. However, in these patents, the coded patterns projected by the coded pattern projectors are generally fixed; it is always the case that through an emitted laser beam, a speckle pattern is formed after interferometric imaging and diffuse reflection on an object surface.

Existing manufacturing methods of coded pattern projectors cost very highly, and in the structured light coding technology, different coded patterns need to be designed for different application scenarios, which in turn significantly increase the research and development costs of a depth perception device. In addition, the coded pattern designed by a coded pattern projector will directly affect the complexity of depth decoding computation as well as the precision and resolution of depth information. Further, a plurality of projecting devices needs to be used during a process of time-space labeling a space using multiple pieces of coded patterns, such that calibration between the plurality of projecting devices not only increases algorithm complexity, but also seriously affects robustness of the devices.

Therefore, a heretofore unaddressed need exists in the art to address the aforementioned deficiencies and inadequacies.

SUMMARY

To address the above problems existing in the prior art, the present disclosure provides a time-space coding method and apparatus for generating a structured light coded pattern, which outputs different coded patterns in time division by driving different light-emitting points based on a regular light-emitting lattice to thereby time-space label a target object or a projection space; in this way, in combination with a time-space depth decoding algorithm, accuracy and robustness of three-dimensional depth measurement may be greatly improved.

To achieve the objective above, the present disclosure provides a time-space coding method for generating a structured light coded pattern, comprising steps of:

S1. designing a regular light-emitting lattice of a certain size;

S2. coding light-emitting particle elements in the regular light-emitting lattice in step S1 in accordance with a coding rule to generate a coded pattern;

S3. performing window uniqueness analysis to the coded pattern generated in step S2; in the case of meeting a window uniqueness distribution requirement, generating a final coded pattern; in the case of failure to meet the requirement, repetitively executing steps S2~S3 till meeting the window uniqueness distribution requirement to thereby generate the final coded pattern.

In addition, the present disclosure further provides a time-space coding apparatus for generating a structured light coded pattern, the apparatus comprising: a light-emitting substrate, a collimator, a driving module, and a display control module, wherein:

a plurality of regularly arranged light-emitting particle elements are distributed on the light-emitting substrate;

the collimator performs collimation processing to light rays emitted by all of the light-emitting particle elements on the light-emitting substrate;

the driving module is configured for driving the regularly arranged light-emitting particle elements on the light-emitting substrate with constant current in an X-Y axis direction;

the display control module selects, in accordance with a coding rule, light-emitting particle elements that meet the coding rule and informs the driving module to drive for displaying the selected light-emitting particle elements.

According to the time-space coding method for generating a structured light coded pattern, different coded patterns are outputted in time division by driving different light-emitting points based on a regular light-emitting lattice so as to time-space label a target object or a projection space, and finally three-dimensional depth measurement of the object is completed through a depth decoding algorithm. This method effectively overcomes the limitations of the fact that in the prior art, a plurality of projectors is needed to project different patterns in time division when it is required to project time-space labels of a plurality of patterns. According to the present method, by driving different light-emitting elements on the light-emitting substrate, different coded patterns are formed, and by using a time-division output technology, time-space labeling of an object may be finalized with only one projector. Moreover, this method significantly improves the accuracy and robustness of three-dimensional depth measurement through time-space coding with a depth decoding algorithm.

DETAILED DESCRIPTION OF EMBODIMENTS

Figure 1:
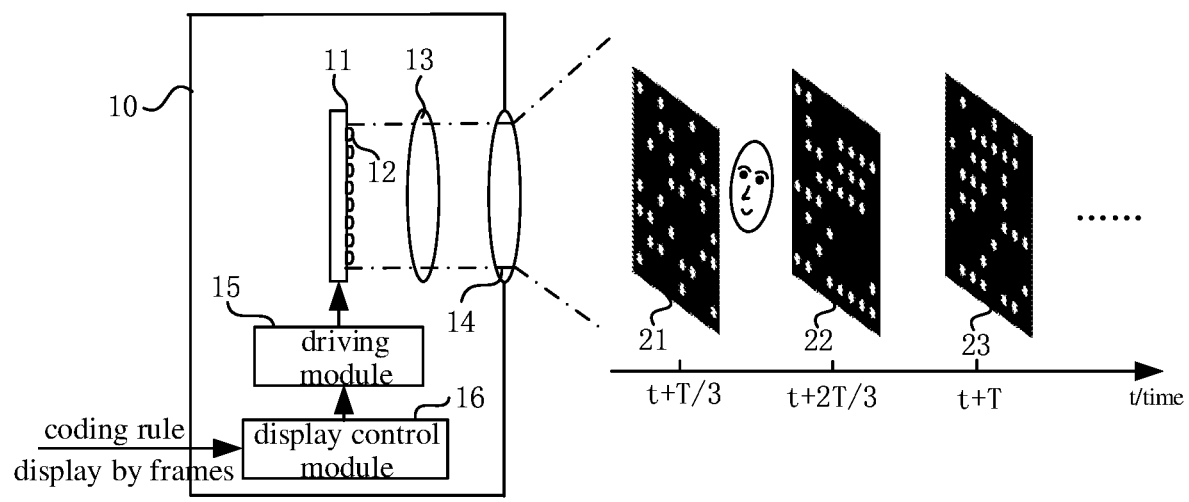
FIG. 1 shows a structural schematic diagram of a time-space coding apparatus for generating a structured light pattern according to the present disclosure.

The present disclosure will now be described more fully hereinafter with reference to the accompanying drawings, in which exemplary embodiments of the present disclosure are shown. The present disclosure may, however, be embodied in many different forms and should not be construed as limited to the embodiments set forth herein. Rather, these embodiments are provided so that this disclosure is thorough and complete, and will fully convey the scope of the disclosure to those skilled in the art. Like reference numerals refer to like elements throughout.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It is appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the disclosure or of any exemplified term. Likewise, the disclosure is not limited to various embodiments given in this specification.

It is understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It is understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present disclosure.

It is understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It are also appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It is further understood that the terms "comprises" and/or "comprising," or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It is understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present disclosure belongs. It is further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around," "about," "substantially" or "approximately" shall generally mean within 20 percent, preferably within 10 percent, and more preferably within 5 percent of a given value or range. Numerical quantities given herein are approximate, meaning that the terms "around," "about," "substantially" or "approximately" can be inferred if not expressly stated.

As used herein, the terms "comprise" or "comprising," "include" or "including," "carry" or "carrying," "has/have" or "having," "contain" or "containing," "involve" or "involving" and the like are to be understood to be open-ended, i.e., to mean including but not limited to.

As used herein, the phrase "at least one of A, B, and C" should be construed to mean a logical (A or B or C), using a non-exclusive logical OR. It should be understood that one or more steps within a method may be executed in different order (or concurrently) without altering the principles of the disclosure.

Embodiments of the disclosure are illustrated in detail hereinafter with reference to accompanying drawings. It should be understood that specific embodiments described herein are merely intended to explain the disclosure, but not intended to limit the disclosure.

To provide a more comprehensive illustration of the embodiments of the present disclosure, a plurality of details will be expounded infra. However, to those skilled in the art, it is apparent that the embodiments of the present disclosure may be implemented without these details. In addition, the features in different embodiments described infra may be combined with one another, unless otherwise specifically indicated.

Hereinafter, the method and apparatus provided by the present disclosure will be described in detail with reference to FIGS. 1-8.

The present disclosure discloses a time-space coding method for generating a structured light coded pattern. As shown in FIG. 1, in this method, by designing a regular light-emitting lattice of a certain shape on a light-emitting substrate 11, and driving, a display control module 16 drives part of light-emitting particle elements 12 according to a coding rule so as to form a coded pattern; the coded pattern, after being directly projected by a collimator 13 or duplicated, arranged, and spliced by a diffractive optical element (DOE) 14, is projected onto a spatial object surface, for space labeling; then, deformations of coded patterns under different distances are decoded and analyzed, to thereby finalize three-dimensional depth measurement of the spatial object, wherein: a plurality of regularly arranged light-emitting particle elements 12 are distributed on the light-emitting substrate 11, the number of the light-emitting particle elements being an integral number (2, 3, 4, . . . k), the light-emitting particle elements 12 being arranged at equal intervals wherein the arrangement density is variable. A light-emitting particle element may be a Vertical Cavity Surface Emitting Laser (VCSEL), a Laser Diode (LD) light-emitting source or an LED light-emitting source.

The driving module 15 is configured to drive the regularly arranged light-emitting particle elements 12 on the light-emitting substrate 11 with a constant current in an X-Y axis direction. It may be chosen to only drive part of the light-emitting particle elements or may be chosen to change a light-emitting intensity of each light-emitting particle element by adjusting current magnitude, thereby forming a greyscale layer.

The display control module 16 selects part of the light-emitting particle elements 12 satisfying a current frame coding rule according to the coding rule and informs the driving module 15 to drive for displaying the selected light-emitting particle elements 12. The display control module 16 may control for displaying in multiple frames based on the coding rule. The coding rule may be issued by an external processor via a standard interface.

The coding rule may be a space coding method, i.e., finalizing space labeling of an object using a fixed structured light coded pattern, including laser random speckle point coding that satisfies window uniqueness, or an M-array coding consisting of specification symbol arrays; it may also be a time-space coding method, i.e., finalizing space labeling of an object by projecting a group of structured light coded patterns sequentially in time division onto a surface of the object, including black-and-white strip structured light, colored strip structured light, and phase-shift structured light, etc.

The collimator 13 performs collimation processing to light rays emitted by all light-emitting particle elements on the light-emitting substrate 11, i.e., causing the emitted light rays to exit in parallel or to be focused according to a certain DOF (Depth of Field) range. The collimator should be dimensioned to be tightly bound with a light-emitting region of the light-emitting substrate 11.

In another embodiment, an additional diffractive optical element (DOE) is further provided, the diffractive optical element (DOE) 14 duplicating and arranging the coded pattern emitted by the light-emitting substrate 11, e.g., m*n blocks, wherein m, n are both natural numbers such as 1, 2, 3 . . . . The DOE will ensure that the respective blocks of duplicated coded patterns, after being spliced, have a relative consistency in contrast, brightness, evenness, and distortion conditions.

Figure 2:
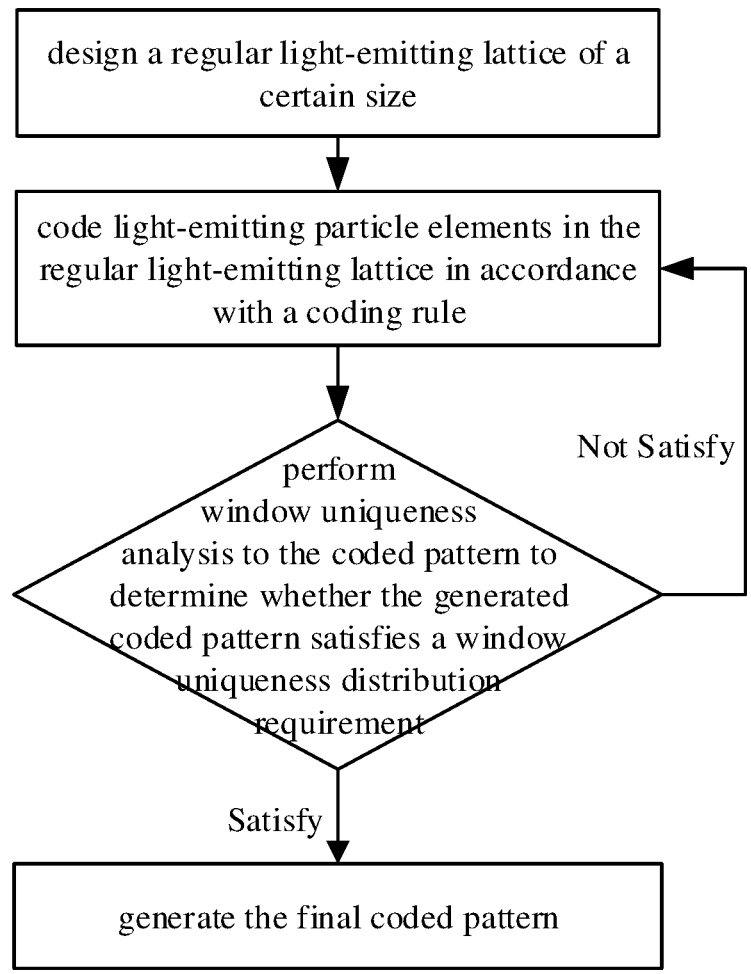
FIG. 2 shows a flow diagram of a time-space coding method for generating a structured light pattern according to the present disclosure.

Hereinafter, a preferred embodiment of a time-space coding method for generating a structured light coded pattern according to the present disclosure will be specifically described with reference to FIGS. 1 and 2. Detailed steps thereof are provided below:

S1. designing a regular light-emitting lattice of a certain size.

Figure 3A:
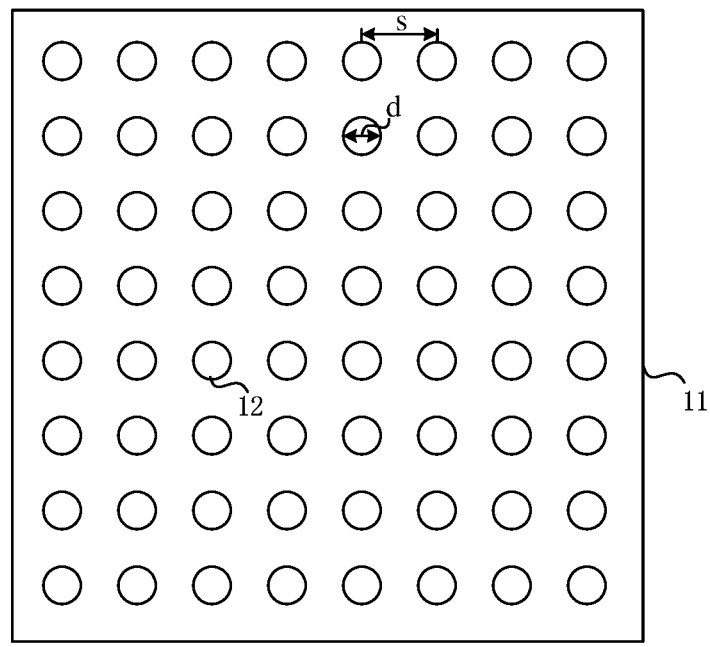
FIG. 3(a) shows a schematic diagram of an embodiment of arrangement of a regular light-emitting lattice on a light-emitting substrate according to the present disclosure.
Figure 3B:
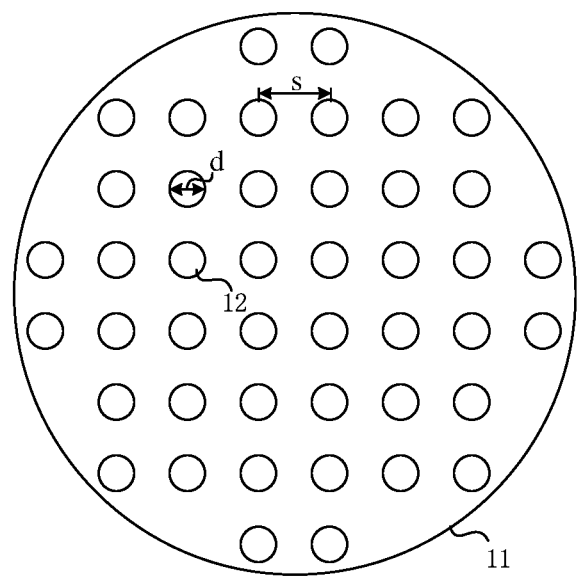
FIG. 3(b) shows a schematic diagram of another embodiment of arrangement of a regular light-emitting lattice on a light-emitting substrate according to the present disclosure.

The regular light-emitting lattice may be designed into a square shape or a rectangular shape or into shapes such as a triangle or a circle; exemplarily, as shown in FIGS. 3(a)~(b), the regular light-emitting lattice is designed in a square or circular arrangement.

S2. coding light-emitting particle elements in the regular light-emitting lattice based on a coding rule to generate a coded pattern.

A light-emitting particle element may be a Vertical Cavity Surface Emitting Laser (VCSEL), a Laser Diode (LD) light-emitting source or an LED light-emitting source.

The coding rule may be a space coding method, i.e., finalizing space labeling of an object using a fixed structured light coded pattern, including laser random speckle point coding that satisfies window uniqueness, or an M-array coding consisting of specification symbol arrays; it may also be a time-space coding method, i.e., finalizing space labeling of an object by projecting a group of structured light coded patterns sequentially in time division onto a surface of the object, including black-and-white strip structured light, colored strip structured light, and phase-shift structured light, etc.

Figures 4A, 4B:
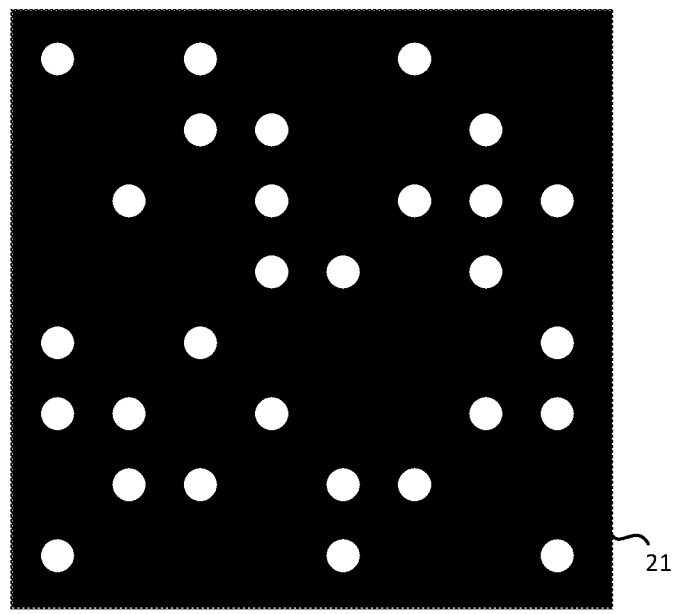
FIG. 4(a) shows a schematic diagram of an embodiment of coding light-emitting particle elements on a light-emitting lattice based on a coding rule according to the present disclosure.
FIG. 4(b) shows a schematic diagram of a projected coded pattern generated based on the coding rule shown in FIG. 4(a) according to the present disclosure.
Figures 5A, 5B:
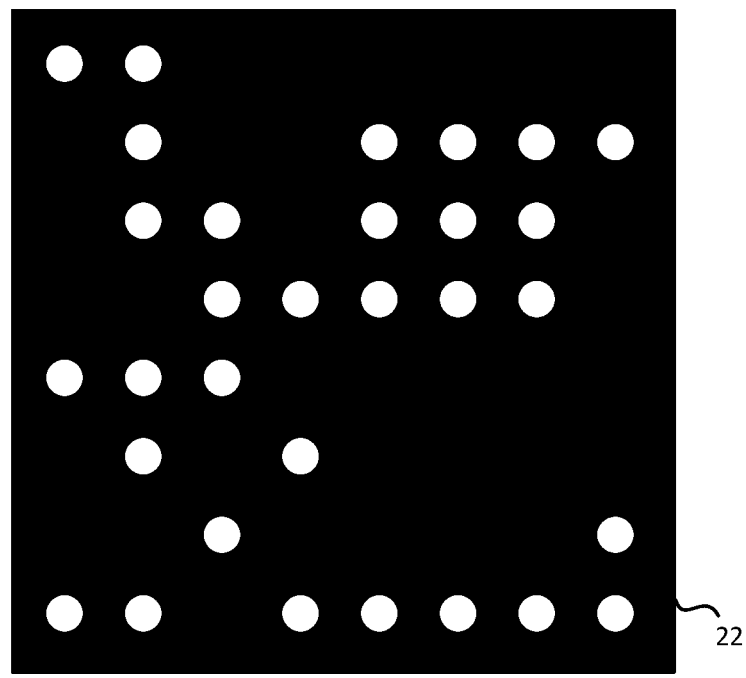
FIG. 5(a) shows a schematic diagram of a second embodiment of coding light-emitting particle elements on a light-emitting lattice based on a coding rule according to the present disclosure.
FIG. 5(b) shows a schematic diagram of a projected coded pattern generated based on the coding rule shown in FIG. 5(a) according to the present disclosure.
Figures 6A, 6B:
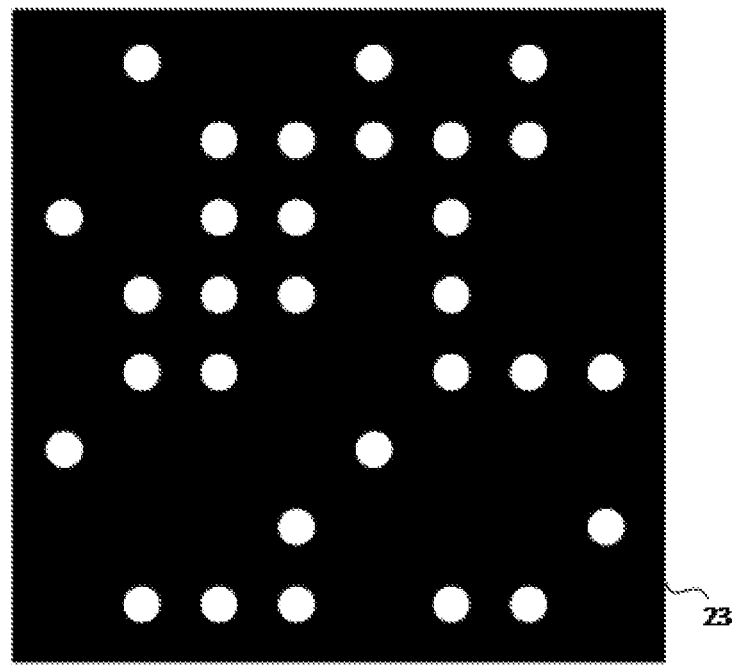
FIG. 6(a) shows a schematic diagram of a third embodiment of coding light-emitting particle elements on a light-emitting lattice based on a coding rule according to the present disclosure.
FIG. 6(b) shows a schematic diagram of a projected coded pattern generated based on the coding rule shown in FIG. 6(a) according to the present disclosure.

A set of random arrays may be generated using a random array generating function, sized to be identical to the regular light-emitting lattice. An array only has two elements: 0 and 1, where 0 indicates not turning on the light-emitting particle element at that position, while 1 indicates turning on the light-emitting particle element at that position; the final coding display results of the light-emitting particle elements are shown in FIG. 4(a), FIG. 5(a), and FIG. 6(a). The finally generated coding patterns are shown in FIGS. 4(b), 5(b), and 6(b).

S3. performing window uniqueness analysis to the coded pattern generated in step S2, i.e., determining whether the generated coded pattern satisfies a window uniqueness distribution requirement; in the case of meeting the window uniqueness distribution requirement, generating a final coded pattern; in the case of failure to meet the requirement, repetitively executing steps S2~S3 till meeting the window uniqueness distribution requirement, thereby generating the final coded pattern.

The window uniqueness distribution means a coded pattern block consisting of all k1×k2 submatrices only appears once in a certain search range (a r×v array, where r and v are both positive integers) of the structured light coded patterns (where k1 and k2 are positive integers and k1<r, and k2<v), i.e., the coded pattern block is unique so as to be distinguished from other coded pattern blocks of a same size.

In another embodiment, the method may further comprise: S4. projecting the finally generated coded pattern in S3 directly or through duplication, arrangement, and splicing, onto a surface of a space object, to thereby finalize three-dimensional depth measurement of the object.

The duplication, arrangement, and splicing refer to splicing the coded pattern generated on the light-emitting substrate in step S3. The specific methods include a staggered-row array manner and an array rotating manner, etc.

Figure 7:
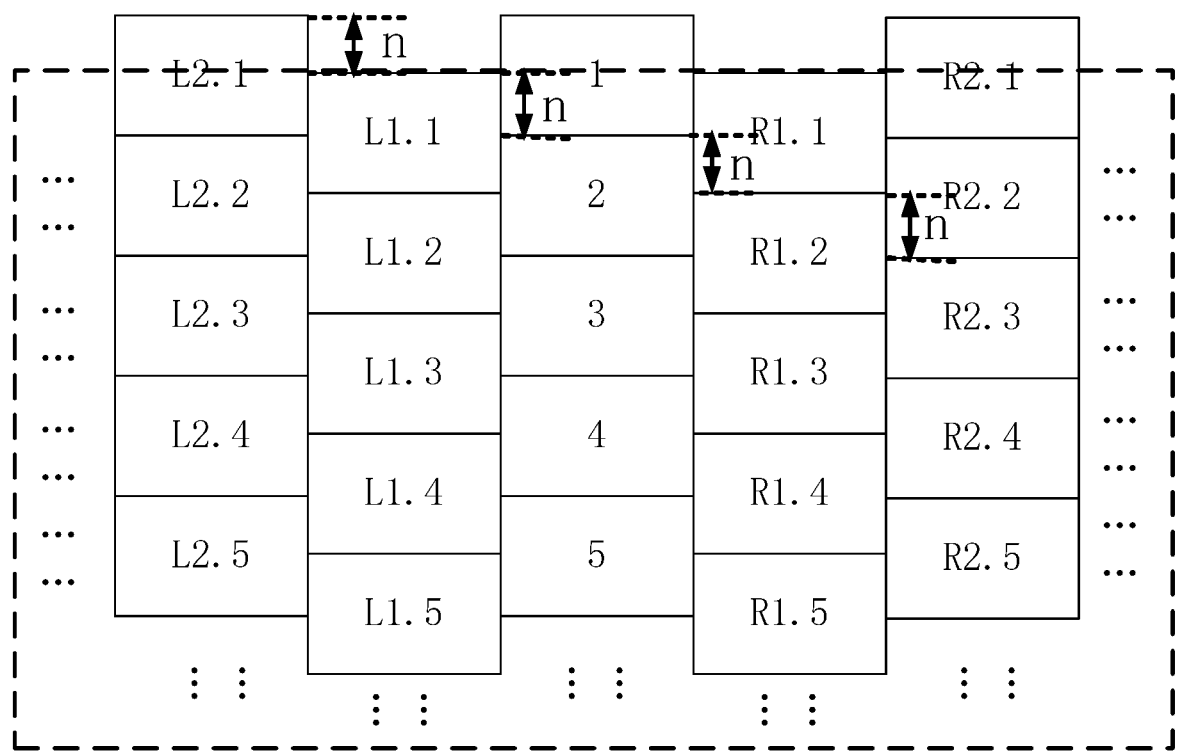
FIG. 7 shows a schematic diagram of an embodiment of splicing for extension a coded pattern generated on a light-emitting substrate in a staggered-row array fashion according to the present disclosure.

The staggered-row array manner is specifically shown in FIG. 7, in which respective blocks (1.1, 1.2, 1.3 . . . ) indicate coded patterns generated after the light-emitting particle elements are driven, and each row of coded patterns may be stepwise staggered in a vertical direction by a certain number of rows from its laterally adjacent row(s) of coded patterns, e.g., staggered by half of the height of the coded pattern or by setting n rows (n is a positive integer).

Figures 8A, 8B:
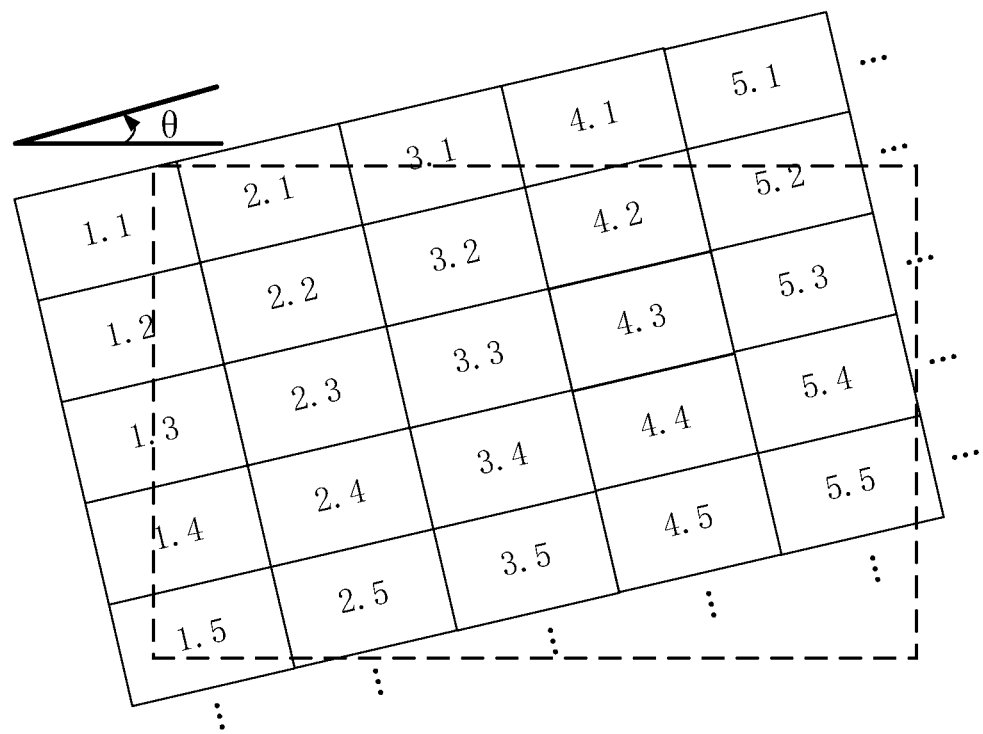
FIG. 8(a) shows a schematic diagram of an embodiment before coded patterns generated on a light-emitting substrate are spliced for extension in a rotary array fashion according to the present disclosure.
FIG. 8(b) shows a schematic diagram of an embodiment after coded patterns generated on a light-emitting substrate are spliced for extension in a rotary array fashion according to the present disclosure.

An array rotary manner is specifically shown in FIG. 8(a)~FIG. 8(b). FIG. 8(a) is a coded pattern array before rotation; FIG. 8(b) is a coded pattern array after rotation; the rotation may be made by an angle θ clockwise or counterclockwise, and the angle may be set according to a subsequent window uniqueness determination criterion and a search range required by a ranging scope.

Through the step S4, the structured light coded pattern generated according to this method may be applied for three-dimensional depth measurement.

In another embodiment, based on the method disclosed in the embodiments above, the present disclosure further provides a time-space coding apparatus for generating a structured light coded pattern, as shown in FIG. 1, characterized in that the apparatus 10 comprises a light emitting substrate 11, a collimator 13, a driving module 15, and a display control module 16, Wherein: a plurality of regularly arranged light-emitting particle elements 12 are distributed on the light-emitting substrate 11, the number of the light-emitting particle elements being an integral number (2, 3, 4, . . . k), the light-emitting particle elements 12 being arranged at equal intervals wherein the arrangement density is variable. The light-emitting particle element may be a Vertical Cavity Surface Emitting Laser (VCSEL), a Laser Diode (LD) light-emitting source or an LED light-emitting source.

The driving module 15 is configured to drive the regularly arranged light-emitting particle elements 12 on the light-emitting substrate 11 with a constant current in an X-Y axis direction. It may be chosen to only drive part of the light-emitting particle elements or may be chosen to change a light-emitting intensity of each light-emitting particle element by adjusting current magnitude, thereby forming a greyscale layer.

The display control module 16 selects part of the light-emitting particle elements 12 satisfying a current frame coding rule according to the coding rule and informs the driving module 15 to drive for displaying the selected light-emitting particle elements 12. The display control module 16 may control for displaying in multiple frames based on the coding rule. The coding rule may be issued by an external processor via a standard interface.

The collimator 13 performs collimation processing to light rays emitted by all light-emitting particle elements 12 on the light-emitting substrate 11, i.e., causing the emitted light rays to exit in parallel or to be focused according to a certain Depth of Field (DOF) range. The collimator should be dimensioned to be tightly bound with a light-emitting region of the light-emitting substrate 11.

In another embodiment, the apparatus for generating a structured light coded pattern may further comprise a diffractive optical element (DOE) 14, the diffractive optical element (DOE) 14 duplicating and arranging the coded pattern emitted by the light-emitting substrate 11, e.g., m*n blocks, wherein m, n are both natural numbers such as 1, 2, 3 . . . . The DOE will ensure that the respective duplicated blocks of the coded pattern, after being spliced, have a relative consistency in contrast, brightness, evenness, and distortion conditions.

As far as this embodiment is concerned, the apparatus has the following basic functions: the display control module 16 generates different shapes of coded patterns according to the coding rule issued by the external processor through constant-current drive control by the driving module 15 with respect to turning-on/off and light emitting intensity of the regularly arranged light emitting particle elements 12 on the light emitting substrate 11, such that light emitting points (or laser speckle points) formed after turning on the light emitting particle elements in the coded pattern are converged by the collimator 13 to form a speckle point that has a more focused energy and a more prominent feature; further, the coded pattern formed by the speckle point is subject to duplication, arrangement, and further splicing by the diffractive optical element (DOE) to thereby perform time-space labeling to the target object or projection space.

Preferably, the light-emitting substrate 11 may be designed into a square shape or a rectangular shape or into shapes such as a triangle or a circle; exemplarily, as shown in FIGS. 3(a)~(b), the light-emitting substrate 11 is designed into a square or circular arrangement.

Preferably, the light emitting particle elements 12 are evenly and regularly arranged on the light emitting substrate 11. As shown in FIG. 2, the light emitting particle elements 12 may be circular light emitting particles with an aperture d, which are evenly distributed on a square or circular light emitting substrate 11 according to a rule that every two adjacent centers have an interval of s, and the distribution density is variable.

Preferably, the display control module 16 may separately control individual light emitting particle elements through an X-Y direction drive circuit, i.e., each light emitting particle element has a corresponding switching signal and current intensity signal; a plurality of light emitting particle elements may be subject to uniform control, i.e., a plurality of light emitting particle elements in a same group have a same switching signal and current intensity signal, such that the plurality of light emitting particle elements are either simultaneously turned on or simultaneously turned off.

Preferably, the display control module 16 comprises an external communication interface via which a user controls on and off of each light emitting particle element on the light emitting substrate 11 or adjusts a light emitting brightness, thereby generating different shapes of coded patterns designed by the user. Exemplarily, FIGS. 4(a)-4(b) show a piece of random speckle pattern turned on according to a distribution condition of the light emitting particle elements on the light emitting substrate of FIG. 3(a) and a group of randomly generated two-dimensional arrays (the two-dimensional arrays are sized in a one-to-one correspondence with distribution of the light-emitting particles; in the array, there only exists 0 and 1, where 0 indicates turning off the light emitting particles at corresponding positions, and 1 indicates turning on the light emitting particle at the corresponding positions, where the black dots represent the turned-on light-emitting particle elements.

Preferably, the display control module 16 may not only control projection of a fixed coded pattern to label the space object, but also may control time-division output of a plurality of different coded patters, e.g., coded pattern 21, coded pattern 22, and coded pattern 23 shown in FIG. 1, which may multi-frame drive part of the light emitting particles and then time-space label the target object or projection space.

The present disclosure not only supports structured light modes (e.g., infrared light, visible light, ultraviolet light, invisible light, etc.) generated by different kinds of laser sources, but also may exploit projection schemes for different shapes of light-emitting particles, e.g., round dot shape, block shape, cross shape, strip shape, etc. Therefore, all modifications and improvements without departing from the spirit and scope of the present disclosure should be included within the scope of the appending claims.

The embodiments above only schematically illustrate the principle of the present disclosure. It should be understood that the modifications and alterations of the arrangements and the details described herein will be obvious to those skilled in the art. Therefore, the present disclosure is not intended to be limited by the scope of the claims, not limited to the specific details of the present disclosure provided to illustrate and describe the embodiments.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A time-space coding method for generating a structured light coded pattern, comprising steps of:
    S1: designing a regular light-emitting lattice of a certain size;
    S2: coding light-emitting particle elements in the regular light-emitting lattice in step S1 in accordance with a coding rule to generate a coded pattern; and
    S3: performing window uniqueness analysis to the coded pattern generated in step S2; in the case of meeting a window uniqueness distribution requirement, generating a final coded pattern; in the case of failure to meet the requirement, repetitively executing steps S2~S3 till meeting the window uniqueness distribution requirement to thereby generate the final coded pattern.

2. The generating method according to claim 1, further comprising:
    S4: projecting the finally generated coded pattern in S3 directly or through duplication, arrangement, and splicing, onto a surface of a space object, to thereby finalize three-dimensional depth measurement of the object.

3. The method according to claim 1, wherein the regular light-emitting lattice is arranged into a square shape, a rectangular shape, a circular shape, or a triangular shape.

4. The method according to claim 1, wherein the coding rule is a space coding method or a time-space coding method.

5. A time-space coding apparatus for generating a structured light coded pattern, comprising:
    a light-emitting substrate;
    a collimator;
    a driving module; and
    a display control module, wherein
    a plurality of regularly arranged light-emitting particle elements are distributed on the light-emitting substrate;
    the collimator performs collimation processing to light rays emitted by all of the light-emitting particle elements on the light-emitting substrate;
    the driving module is configured for driving the regularly arranged light-emitting particle elements on the light-emitting substrate with constant current in an X-Y axis direction; and
    the display control module selects, in accordance with a coding rule, light-emitting particle elements that meet the coding rule and informs the driving module to drive for displaying the selected light-emitting particle elements.

6. The apparatus according to claim 5, further comprising:
    a diffractive optical element (DOE) that duplicates, arranges, and further splices a coded pattern emitted by the light-emitting substrate.

7. The apparatus according to claim 5, wherein the light-emitting substrate is of a square shape, a rectangular shape, a circular shape, or a triangular shape.

8. The apparatus according to claim 5, wherein the display control module separately controls individual light emitting particle elements, each light emitting particle element has a corresponding switching signal and current intensity signal; or a plurality of light emitting particle elements can be subject to uniform control, a plurality of light emitting particle elements in a same group have a same switching signal and current intensity signal so as to be either simultaneously turned on or simultaneously turned off.

9. The apparatus according to claim 5, wherein the display control module comprises an external communication interface via which a user controls on and off of each light emitting particle element on the light emitting substrate or adjusts a light emitting brightness, thereby generating different shapes of coded patterns designed by a user.

10. The apparatus according to claim 5, wherein the display control module cannot only control projection of a fixed coded pattern to label the space object, but also can control time-division output of a plurality of different coded patterns, thereby time-space labelling the target object or projection space.

* * * * *